United States Patent
Chern et al.

(10) Patent No.: US 11,038,504 B2
(45) Date of Patent: *Jun. 15, 2021

(54) GENERATING HIGH DYNAMIC VOLTAGE BOOST

(71) Applicant: Taiwan Semiconductor Manufacturing Company Limited, Hsinchu (TW)

(72) Inventors: Chan-Hong Chern, Palo Alto, CA (US); Tysh-Bin Liu, Hsinchu County (TW); Kun-Lung Chen, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/897,541

(22) Filed: Jun. 10, 2020

(65) Prior Publication Data

US 2020/0304119 A1 Sep. 24, 2020

Related U.S. Application Data

(63) Continuation of application No. 16/165,047, filed on Oct. 19, 2018, now Pat. No. 10,715,137.

(60) Provisional application No. 62/575,565, filed on Oct. 23, 2017.

(51) Int. Cl.
*H03K 17/687* (2006.01)
*H02M 3/07* (2006.01)
*H03K 17/06* (2006.01)

(52) U.S. Cl.
CPC .......... *H03K 17/6871* (2013.01); *H02M 3/07* (2013.01); *H03K 17/063* (2013.01); *H03K 2217/0081* (2013.01)

(58) Field of Classification Search
CPC ............. H03K 17/687; H03K 17/6871; H03K 17/6874; H03K 17/063; H03K 2217/081; H03K 2017/6875; H03K 19/09443; H03K 19/09482; H03K 19/01714; H03K 19/01735; H02M 3/07; H02M 3/073
See application file for complete search history.

(56) References Cited

U.S. PATENT DOCUMENTS

| | | | |
|---|---|---|---|
| 6,060,948 A | 5/2000 | Tarantola et al. | |
| 9,571,038 B1 | 2/2017 | van Holland et al. | |
| 10,050,621 B2 * | 8/2018 | Chern | H03K 17/6877 |
| 10,284,195 B2 * | 5/2019 | Chern | H02M 3/07 |
| 10,715,137 B2 * | 7/2020 | Chern | H03K 17/063 |
| 2015/0162832 A1 | 6/2015 | Briere | |
| 2019/0103804 A1 | 4/2019 | Knoedgen et al. | |

* cited by examiner

*Primary Examiner* — Long Nguyen
(74) *Attorney, Agent, or Firm* — Jones Day (57) ABSTRACT

Devices, systems, and methods are provided for generating a high, dynamic voltage boost. An integrated circuit (IC) includes a driving circuit having a first stage and a second stage. The driving circuit is configured to provide an overdrive voltage. The IC also includes a charge pump circuit coupled between the first stage and the second stage. The charge pump circuit is configured generate a dynamic voltage greater than the overdrive voltage. The IC also includes a bootstrap circuit coupled to the charge pump circuit, configured to further dynamically boost the overdrive voltage of the driving circuit.

20 Claims, 10 Drawing Sheets

GENERATING HIGH DYNAMIC VOLTAGE BOOST

PRIORITY CLAIM

The present application is a continuation to U.S. application Ser. No. 16/165,047, filed Oct. 19, 2018, which claims priority U.S. Application No. 62/575,565, filed Oct. 23, 2017, the contents of which are incorporated by reference herein in their entirety.

FIELD

The technology described in this disclosure relates generally to electronic devices and more particularly to high-side integrated driver circuits.

BACKGROUND

High-side integrated driver circuits implemented by Gallium Nitride (GaN) High Electron Mobility Transistors (HEMT) enable high-power throughput of various circuitry. HEMTs have a variety of applications including drive operations of discrete power transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Field-effect transistors (FETs) are transistors that operate an electrical device using an electric field. HEMTs, such as GaN HEMTs are a type of FET. Due to high current density, high breakdown voltage, and low operational resistance, HEMTs are suitable for use in high-power applications. A HEMT device includes a channel layer and an active layer. A two-dimensional electron gas (2DEG) is generated in the channel layer, adjacent an interface with the active layer. The 2DEG is used in the HEMT structure as charge carriers, which enables current flow within the device. A consideration in designing HEMT structures involves breakdown voltage improvements. A breakdown voltage of an HEMT structure is a drain-to-gate voltage at which the drain-to-gate current sharply increases. A high breakdown voltage indicates the ability of the HEMT structure to withstand a high drain-to-gate voltage without being damaged and/or exhibiting irregular current behaviors.

HEMTs, such as GaN HEMTs, have a variety of useful applications. GaN HEMTs is capable of delivering large amounts of power because of their unique combination of material characteristics including high breakdown fields, wide bandgaps (e.g., 3.36 eV for GaN at room temperature), high current density, large conduction band offset, and high saturated electron drift velocity. Specifically, in one example, GaN HEMTs can be used in power conversion and radio frequency (RF) power amplifier (PA)/switch applications, where GaN HEMTs typically have smaller form factors compared to Silicon (Si) based transistors. Due in part to low hole mobility within p-type components along with a two-dimension hole gas (2DHG) band structure, p-type HEMTs are less favorable for use than an n-type GaN HEMT for the embodiments described herein. Because of this, n-type GaN HEMTs are sometimes integrated within various integrated circuits instead of p-type HEMTs.

Enhancement mode HEMT (E-HEMT) and depletion mode HEMT (D-HEMT) are example n-type HEMTs. An E-HEMT requires a positive gate voltage to attract electrons towards the gate or an appropriate doping level in a neighboring barrier to attract electrons toward the gate. Electrons attracted toward the gate form a 2DEG and enable current flow within the E-HEMT. In other words, an E-HEMT is turned on/activated by pulling the gate terminal thereof to a voltage level higher than a level of a threshold voltage, $V_{th}$.

Conversely, a D-HEMT is in an on state at a zero gate-source voltage as formation of a 2DEG occurs even without positive gate-source voltage. In other words, a D-HEMT is in an on state at the zero gate-source voltage and turns off when a negative gate voltage is applied. As such, it has a negative threshold voltage (e.g., −1.0V).

Static current within an integrated circuit can cause damage to its electrical components in addition to increase overall power consumption. In order to minimize static current of integrated circuits, it may be necessary to limit the usage of D-HEMTs as pull-up devices and primarily utilize E-HEMT devices instead. This is because D-HEMTs are operating in static conditions with a zero gate voltage. Having a multistage E-HEMT device can help to minimize static current within the integrated circuit. Each stage of an E-HEMT device, however, can consume at least one threshold voltage, $V_t$ (e.g., ~2V when Vt is ~1.5V having a 3-σ variation of approximately 0.5V), to turn on, which ultimately decreases the initial input voltage level such that an output voltage is lower than the input voltage to remainder of the integrated circuit. In order to provide a voltage (e.g., overdrive voltage) sufficient for the remainder of the integrated circuit, ample gate voltage, $V_{gs}$, is provided to the first stage of the multi-stage E-HEMT device. The overdrive voltage, in accordance with some embodiments, can be provided using a combination of internal bootstrap circuits and a charge pump circuit. This combination can also minimize the number of D-HEMT devices in a multistage driving circuit and reduce the static current of a driving circuit (or high-side driver).

Figure 1:
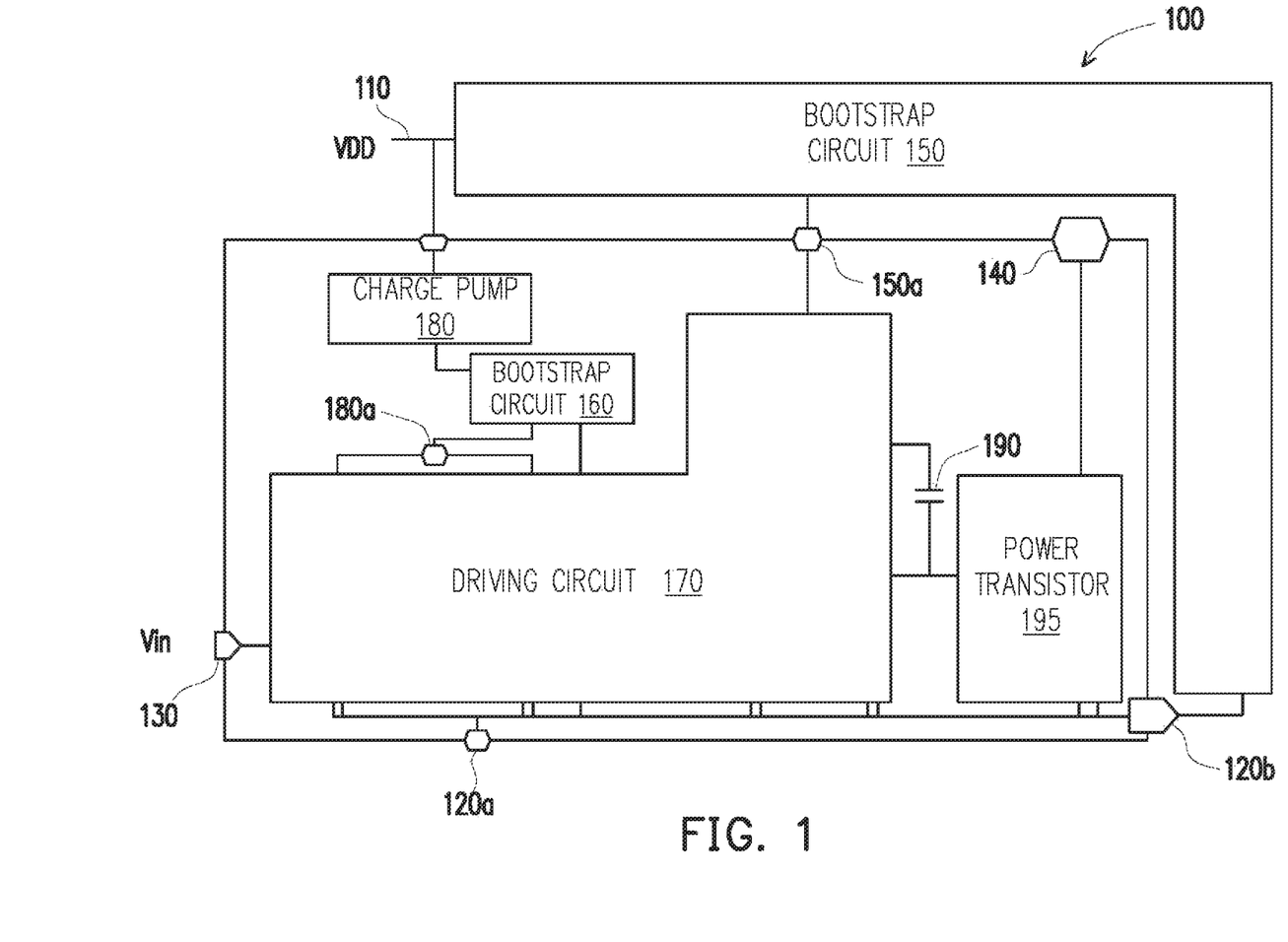
FIG. 1 is a schematic diagram of a first exemplary semiconductor device in accordance with various embodiments of the present disclosure.

FIG. 1 is a schematic diagram of a first exemplary semiconductor device 100 in accordance with various embodiments of the present disclosure. Semiconductor device 100 is an integrated circuit device having a plurality of stages for driving power transistor 195 and any other electronic components coupled thereto. The use of bootstrap circuits 150, 160 and charge pump circuit 180 enable an overdrive voltage to pass through the semiconductor device 100. The overdrive voltage drives power transistor 195 and any additional components coupled thereto. With the overdrive voltage, the power transistor 195 and any additional components can operate at rated electrical levels. The various embodiments described herein can also minimize static current or other current losses to enable more efficient power delivery.

In accordance with some embodiments, the semiconductor device 100 (e.g., an integrated circuit (IC)), includes source voltage pin 110, high-side reference voltage pins 120a, 120b, an input voltage pin 130, an high-voltage power supply pin 140, a bootstrap voltage pin 150a, bootstrap circuits 150, 160, a driving circuit 170, a charge pump circuit 180, a charge pump voltage pin 180a, a bootstrap capacitor 190, and a power transistor 195. In this embodiment, the semiconductor device 100 is implemented using HEMTs, each of which includes first and second source/drain terminals and a gate terminal. In an alternative embodiment, the semiconductor device 100 is implemented using a combination of HEMTs and metal-oxide-semiconductor field-effect transistors (MOSFETs).

In this embodiment, the semiconductor device 100 further includes a package, which encapsulates the power transistor 195, the driving circuit 170, bootstrap circuits 150, 160, and the charge pump circuit 180 therein, and into which the voltages pins 110, 120a, 120b, 130, and 140 extend.

The source voltage pin 110 is configured to be connected to an external power source, whereby the source voltage, $V_{DD}$, e.g., 6.0V, is applied thereto. The source voltage is provided to bootstrap circuit 150 and charge pump circuit 180. The high-side reference voltage pins 120a, 120b are configured to be connected to a switching node of a half- or full-bridge power converter, whereby a load (e.g., an inductive load, a capacitive load, or a combination thereof) is connected thereto. The input pin 130 is configured to be coupled to an external signal source, e.g., a pulse-width modulation (PWM) circuit, whereby an input signal that transitions between a low voltage level (e.g., a level of the reference voltage, $V_{SS}$, ~0V), and a high voltage level (e.g., 6~650V), is applied thereto. The high-voltage power supply pin 140 is configured to be connected to high-voltage power supply (e.g. 650V). Power transistor 195 coupled to output pin (or switching node) 120a/120b provides the driving voltage for a load coupled thereto. Power transistor 195 in accordance with some embodiments requires a minimum gate voltage for operation (e.g., 652V). Bootstrap voltage pin 150a and charge pump voltage pin 180a are electrical points which provide additional voltage to enable operation of power transistor 195. Operation of power transistor 195 enables operation of additional components coupled to output pin 120b.

A supply voltage, $V_{DD}$, is provided to a charge pump circuit 180. The charge pump circuit 180 is coupled to bootstrap circuit 160. The charge pump circuit 180 provides a dynamic charge pump voltage boosting voltages of driving circuit 170, as described in more detail in FIG. 2. Due the voltage losses associated with electrical components of driving circuit 170 as described in more detail in FIG. 2, significantly large dynamic charge pump voltage is needed to provide substantial overdrive voltage at the first voltage stage in order to provide sufficient voltage to the remaining components of the integrated circuit, in particular to the output pin 120b. In order to achieve a near full-rail pull-up voltage and fast slew rate of the semiconductor device 100, a large overdrive voltage may be necessary for power transistor 195 (e.g., $V_{gs}-V_t \gg 0$).

Figure 2:
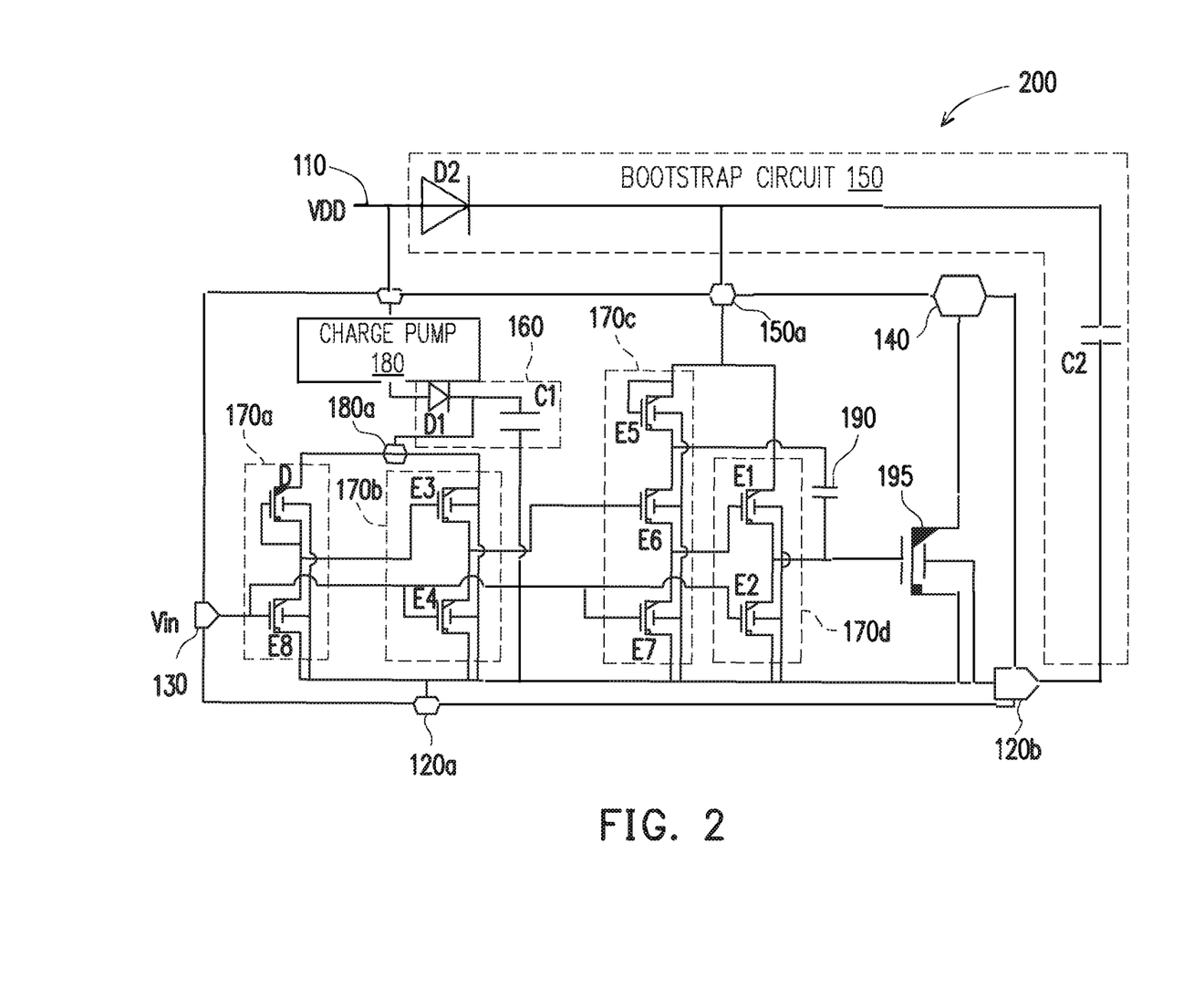
FIG. 2 is a schematic diagram of a second exemplary semiconductor device in accordance with various embodiments of the present disclosure.

FIG. 2 is a schematic diagram of a second exemplary semiconductor device 200 in accordance with various embodiments of the present disclosure. In this embodiment, the power transistor 195 is a III-V compound semiconductor-based, e.g., GaN-based, E-HEMT and has a high voltage rating, e.g., above 100V or 650V, depending on applications. In an alternative embodiment, the power transistor 195 is a depletion-mode HEMT. In some embodiments, the power transistor 195 may be any compound semiconductor-based, e.g., II-VI or IV-IV compound semiconductor-based, HEMT. As illustrated in FIG. 2, the second source/drain terminal of the power transistor 195 is coupled to the output pins 120a/120b and the first source/drain terminal is coupled to a high-voltage power supply pin 140.

The driving circuit 170 is configured to provide sufficient voltage to drive the power transistor 195. Driving circuit 170 includes a plurality of stages 170a, 170b, 170c, 170d that each operate as an inverter. In accordance with some embodiments, each of the stages 170b and 170d includes a pair of E-HEMTs E1, E2, E3, E4. Stage 170c includes three E-HEMTs E5, E6, E7. Due to electrical configuration of the E-HEMTs E3, E6, E1 as source followers, each stage 170b, 170c, 170d can consume at least one threshold voltage, $V_t$, drop across each transistor (e.g., approximately 2V for $V_t$ of approximately 1.5V with 3-σ variation of approximately 0.5V).

The first source/drain terminal of the E-HEMT E1 of stage 170d is coupled to the second source/drain terminal of E-HEMT E2 and to the gate terminal of the power transistor

195. The second source/drain terminal of the E-HEMT E1 of stage 170*d* is coupled to bootstrap voltage pin 150*a*.

The first source/drain terminal of the E-HEMT E6 of stage 170*c* is coupled to the second source/drain terminal of E-HEMT E7 and to the gate terminal of the E-HEMT E1 of stage 170*d*. The second source/drain terminal of E-HEMT E6 is coupled to a first terminal of bootstrap capacitor 190. The second terminal of bootstrap capacitor 190 is coupled to the gate of power transistor 195, the first source/drain terminal of E-HEMT E2 of stage 170*d*, and the second source/drain terminal of E-HEMT E1 of stage 170*d*. The gate of E-HEMT E5 is coupled to the second source/drain terminal of E-HEMT E5, the bootstrap voltage pin 150*a*, and the second source/drain terminal of E-HEMT E1 of stage 170*d*.

The first source/drain terminal of E-HEMT E3 of stage 170*b* and the second source/drain terminal of E-HEMT E4 are coupled to each other and to the gate terminal of E-HEMT E6 of stage 170*c*. The second source/drain terminal of E-HEMT E3 is coupled to charge pump pin 180*a*.

The stage 170*a* includes a D-HEMT D and an E-HEMT E8. The first source/drain terminal and the gate terminal of the D-HEMT D and the first source/drain terminal of the E-HEMT E8 of stage 170*a* are coupled to each other and to the gate terminal of the E-HEMT E3 of stage 170*b*.

The second source/drain terminals of the E-HEMTs E2, E4, E7, E8 of the stages 170*a*, 170*b*, 170*c*, 170*d* are coupled to each other and to the high-side reference voltage pins (or switching node) 120*a*, 120*b*. The gate terminals of the E-HEMTs E2, E4, E7, E8 of the stages 170*a*, 170*b*, 170*c*, 170*d* are coupled to each other and to the input pin 130.

Bootstrap circuit 160 is configured to generate a bootstrap voltage, $V_{BS}$, greater than the source voltage, $V_{DD}$ by a charge pump voltage, and includes a diode D1 and a capacitor C1. In this embodiment, the diode D1 is a two-terminal diode, i.e., has anode and cathode terminals. The anode terminal is coupled to charge pump circuit 180 and the cathode terminal is coupled to the second source/drain terminal of D-HEMT D of stage 170*a*, the second source/drain terminal of E-HEMT E3 of stage 170*b*, and capacitor C1 (via charge pump voltage pin 180*a*). In other words, the capacitor C1 is coupled between charge pump voltage pin 180*a* and the high-side reference voltage pins (or switching nodes) 120*a*, 120*b*. It will be appreciated that, after reading this disclosure, the bootstrap circuit 160 and charge pump circuit 180 may be of any suitable construction so long as it achieves the intended purpose described herein. In accordance with some embodiments, an example suitable charge pump circuit 180 is described in FIG. 4.

Bootstrap circuit 150 is also configured to generate a bootstrap voltage, $V_{BS}$, greater than the source voltage, $V_{DD}$, and includes a diode D2 and a capacitor C2. In this embodiment, the diode D2 is a two-terminal diode, i.e., has anode and cathode terminals. The anode terminal of diode D2 is coupled to source voltage, $V_{DD}$, and charge pump circuit 180. The cathode terminal of diode D2 is coupled to a first terminal of capacitor C2, the gate terminal and second source/drain terminal of E-HEMT E5 of stage 170*c*, and the second source/drain terminal of E-HEMT E1 of stage 170*d* (via external bootstrap voltage pin 150*a*). A second terminal of capacitor C2 is coupled to the high-side reference voltage pins (or switching node) 120*a*, 120*b*.

The charge pump circuit 180 includes an input terminal connected to the source voltage pin 110 and an output terminal. The charge pump circuit 180 is configured to generate a charge pump voltage, $V_{CP}$, at the output terminal thereof greater than the source voltage, $V_{DD}$, at the input terminal thereof. The output terminal of the charge pump circuit 180 is coupled to the anode of diode D1 of internal bootstrap circuit 160.

It should be understood, as illustrated in FIG. 2, that each of the E-HEMTs E1, E2, E3, E4, E5, E6, E7, E8 and D-HEMT D, aside from the first and second source/drain terminals and the gate terminals, further includes a bulk. In an embodiment, the bulks of the E-HEMTs E1, E2, E3, E4, E5, E6, E7, E8 and D-HEMT D are coupled to each other and to the high-side reference voltage pins 120*a*, 120*b*. In another embodiment, the bulks of the E-HEMTs E1, E2, E3, E4, E5, E6, E7, E8 and D-HEMT D are coupled to each other and to the source voltage pin 110. Power transistor 195 also can include a bulk coupled to either the high-side reference voltage pins 120*a*, 120*b* or source voltage pin 110.

In operation, when the input signal at the input pin 130 transitions from the low voltage level, e.g., 0V, to the high voltage level, e.g., 6.0V with respect to the voltage at the high-side reference node (120*a*/120*b*), the E-HEMTs E2, E4, E7, E8 of the stages 170*a*, 170*b*, 170*c*, 170*d* are turned on/activated. As a result, a deactivating voltage, which corresponds to the reference voltage, $V_{SS}$, appears at the gate terminals of the E-HEMTs E1, E3, E6 of the stages 170*b*, 170*c*, 170*d*. This turns off/deactivates the E-HEMTs E1, E3, E6 of the stages 170*b*, 170*c*, 170*d*. This, in turn, charges the bootstrap capacitor 190. At this time, the D-HEMT D of the stage 170*a* is activated and operates as a resistor, the charge pump circuit 180 generates the charge pump voltage, $V_{CP}$, at the output terminal thereof, and thus a static current flows through diode D to the high-side reference node 120*a*. At the same time the bootstrap capacitor C1 is charged. It is noted that, by virtue of the stages 170*b*, 170*c*, 170*d* between the stage 170*a* and the power transistor 150, the driving circuit 170 of the present disclosure has a minimal static current.

In a subsequent operation, when the input signal at the input pin 130 transitions from the high voltage level back to the low voltage level, the E-HEMTs E2, E4, E7, E8 of the stages 170*a*, 170*b*, 170*c*, 170*d* are deactivated. At this time, the D-HEMT D of the stage 170*a* is activated and operates as a resistor, the charge pump circuit 180 generates the charge pump voltage, $V_{CP}$, e.g., 16.0V, at the output terminal thereof, and an activating voltage that corresponds to the charge pump voltage, $V_{CP}$, appears the cathode terminal of diode D1 and the gate terminal of E-HEMT E3 of the stage 170*b*. By virtue of the charge pump circuit 180, an activating voltage, a level of which is high enough to activate the E-HEMT E6 of the stage 170*c*, e.g., 14V after one Vt drop of 2V at E-HEMT E3 of the stage 170*b*, appears at the gate terminal of the E-HEMT E6 of the stage 170*c*. By virtue of the external bootstrap circuit 150, a supply voltage of 656V appears at the drain of E-HEMT E1 of the stage 170*d*. After one more threshold voltage Vt drop of 2V at E-HEMT E6 of the stage 170*c*, a high enough voltage, e.g., 12V+650V appears at the gate terminal of the E-HEMT E1 of the stage 170*d*. As a result, a driving voltage, $V_{drive}$, substantially equal to the source voltage, $V_{DD}$ plus high supply voltage (e.g. 6V+650V=656V), appears at the gate terminal of the power transistor 195.

In an alternative embodiment, the semiconductor device 100 is dispensed with the power transistor 195, the high-side reference voltage pins 120*a*, 120*b*, and the high voltage power supply pin 140. In such an alternative embodiment, the semiconductor device 100 further includes a power transistor pin (not shown) that extends into the package and that is connected to the first source/drain terminals of the E-HEMTs E1, E2 of the stage 170*d*.

Figure 3:
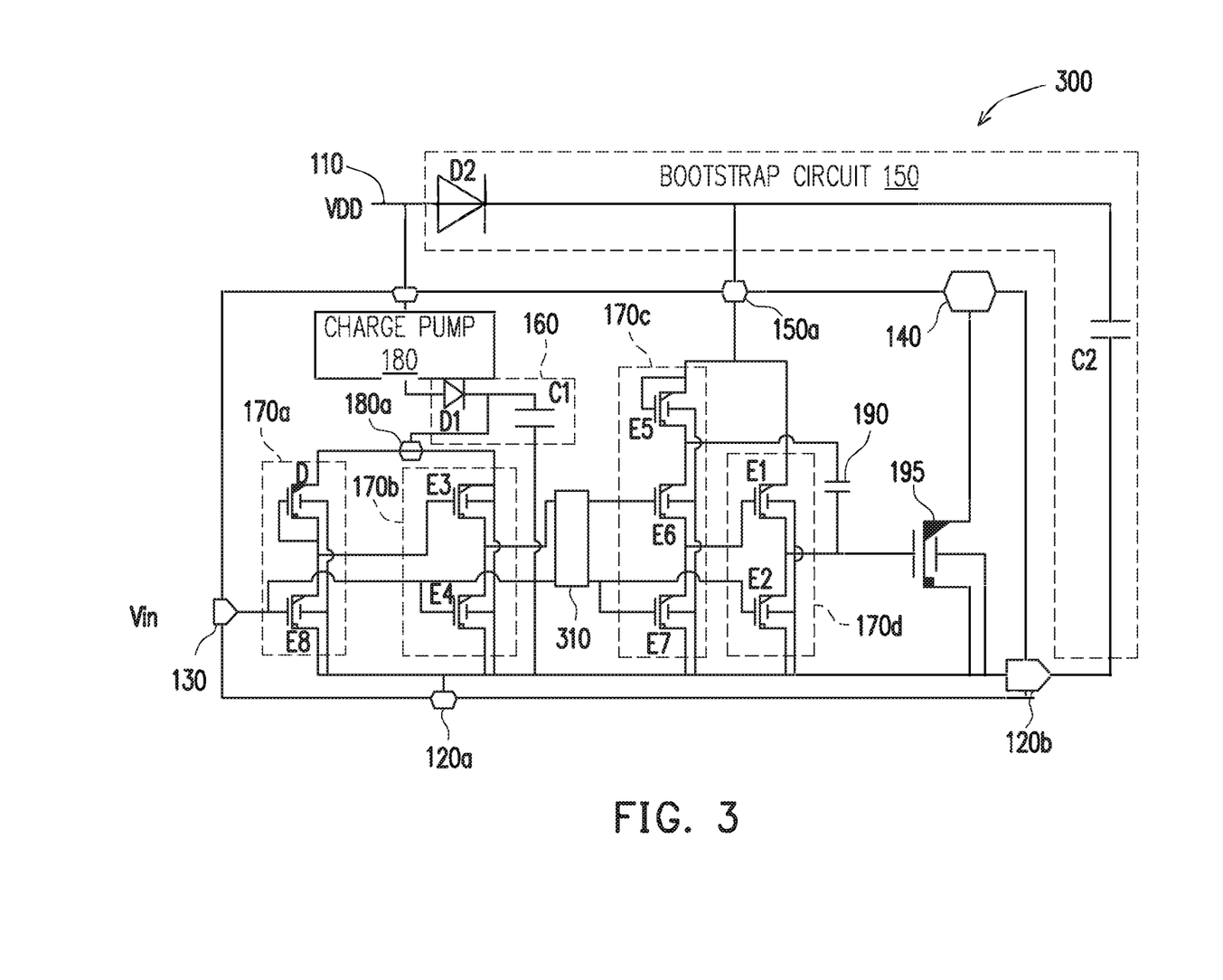
FIG. 3 is another schematic diagram of a third exemplary semiconductor device in accordance with various embodiments of the present disclosure.

FIG. 3 is a schematic diagram of a third exemplary semiconductor device 300 in accordance with various embodiments of the present disclosure. This embodiment differs from the semiconductor device 200 in that the driving circuit 170 of semiconductor device 300 further includes one or more stages 310 between stages 170b, 170c. The construction as such further lowers the static current of the driving circuit 170 of semiconductor device 300.

Figure 4:
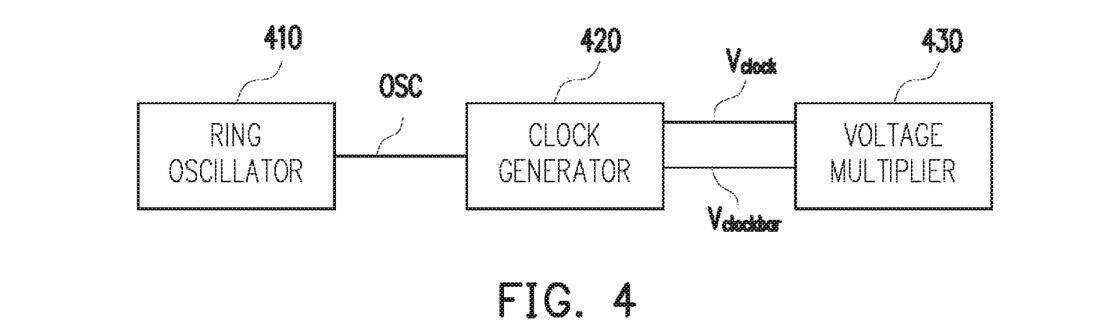
FIG. 4 is a schematic diagram of the charge pump circuit in accordance with various embodiments of the present disclosure.
Figure 5:
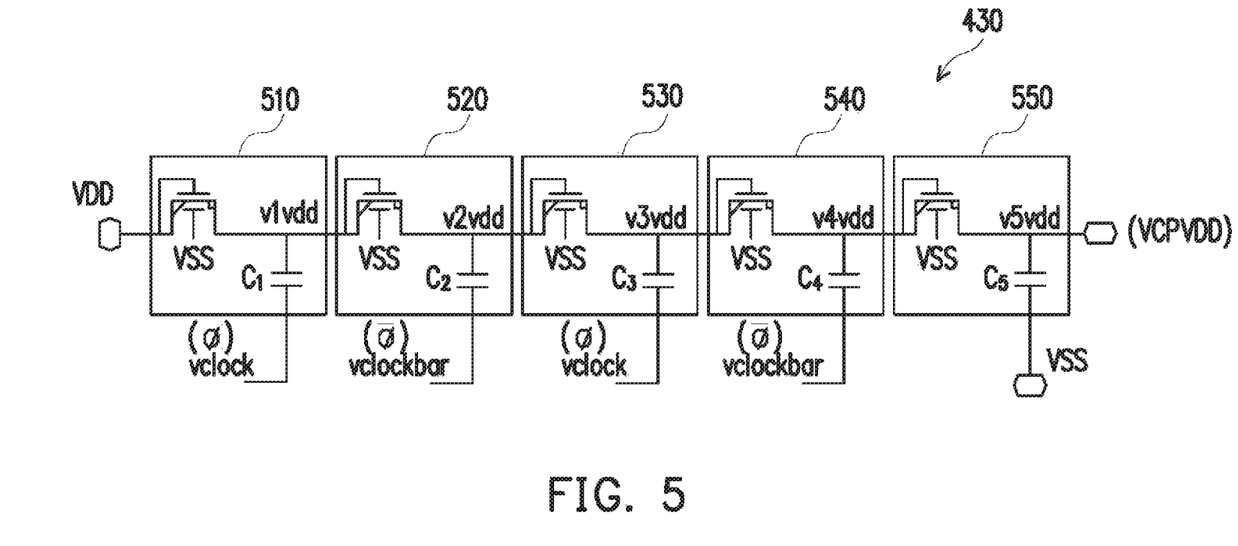
FIG. 5 is a schematic diagram of the voltage multiplier of FIG. 4 in accordance with various embodiments of the present disclosure.

FIG. 4 is a schematic diagram of the charge pump circuit 180 in accordance with various embodiments of the present disclosure. The charge pump circuit 180 includes a ring oscillator 410, a clock generator 420, and a voltage multiplier 430. The ring oscillator 410 provides an output voltage to the clock generator 420. The clock generator 420 provides a complement pair of clock voltages (e.g., $V_{clock}$, $V_{clockbar}$) to voltage multiplier 430. FIG. 5 is a schematic diagram of the voltage multiplier 430 in accordance with various embodiments of the present disclosure. As illustrated in FIG. 5, the voltage multiplier 430 is between the input and output terminals of the charge pump circuit 180. In accordance with some embodiments, the voltage multiplier 430 is a Dickson voltage multiplier/charge pump and includes stages 510, 520, 530, 540, 550, each of which includes a diode-connected E-HEMT and a capacitor ($C_1$, $C_2$, $C_3$, $C_4$, $C_5$).

Figure 6:
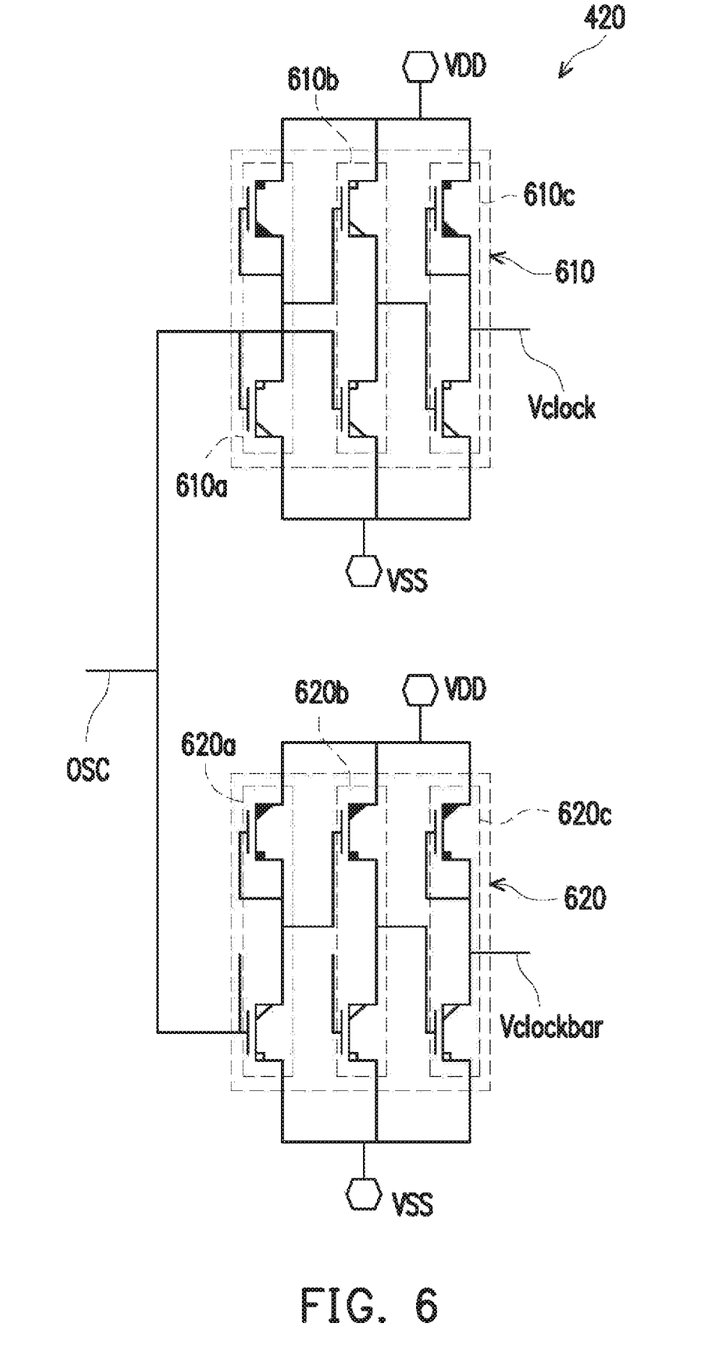
FIG. 6 is a schematic circuit diagram illustrating the clock generator at the output of the ring oscillator of FIG. 4 in accordance with various embodiments of the present disclosure.

FIG. 6 is a schematic diagram of the clock generator 420 in accordance with various embodiments of the present disclosure. As illustrated in FIG. 6, the clock generator 420 includes a true module 610 and a complement module 620. The true module 610 has input and output terminals, is configured to generate a true clock signal, $V_{clock}$, at the output terminal thereof, and includes stages 610a, 610b, 610c between the input and output terminals thereof. The complement module 620 has input and output terminals, is configured to generate at the output terminal thereof a complement clock signal, $V_{clockbar}$, that is a complement of the true clock signal, $V_{clock}$, and includes stages 620a, 620b, 620c between the input and output terminals thereof. Each of the stages 610a, 610b, 610c of the true module 610 and the stages 620a, 620b, 620c of the complement module 620 includes a pair of HEMTs, one of which is a D-HEMT and the other of which is an E-HEMT. The stage 610b of the true module 610 includes a pair of E-HEMTs.

It is noted that, since the true and complement modules 610, 620 have the same number of stages, i.e., three in this embodiment, the true clock signal, $V_{clock}$/complement clock signal, $V_{clockbar}$, does not lead/lag the complement clock signal, $V_{clockbar}$/true clock signal, $V_{clock}$. As such, the true clock signal, $V_{clock}$, and the complement clock signal, $V_{clockbar}$, are substantially 180° out-of-phase with each other.

Although the clock generator 420 is exemplified such that the true and complement modules 610, 620 thereof includes three stages, it will be appreciated that, the true and complement modules 610, 620 may include any number of stages.

With further reference to FIG. 5, the capacitors C of the stages 510 and 530 are connected to each other and to the output terminal of the true module 610, whereas the capacitors C of the stages 520 and 540 are connected to each other and to the output terminal of the complement module 620.

Figure 7:
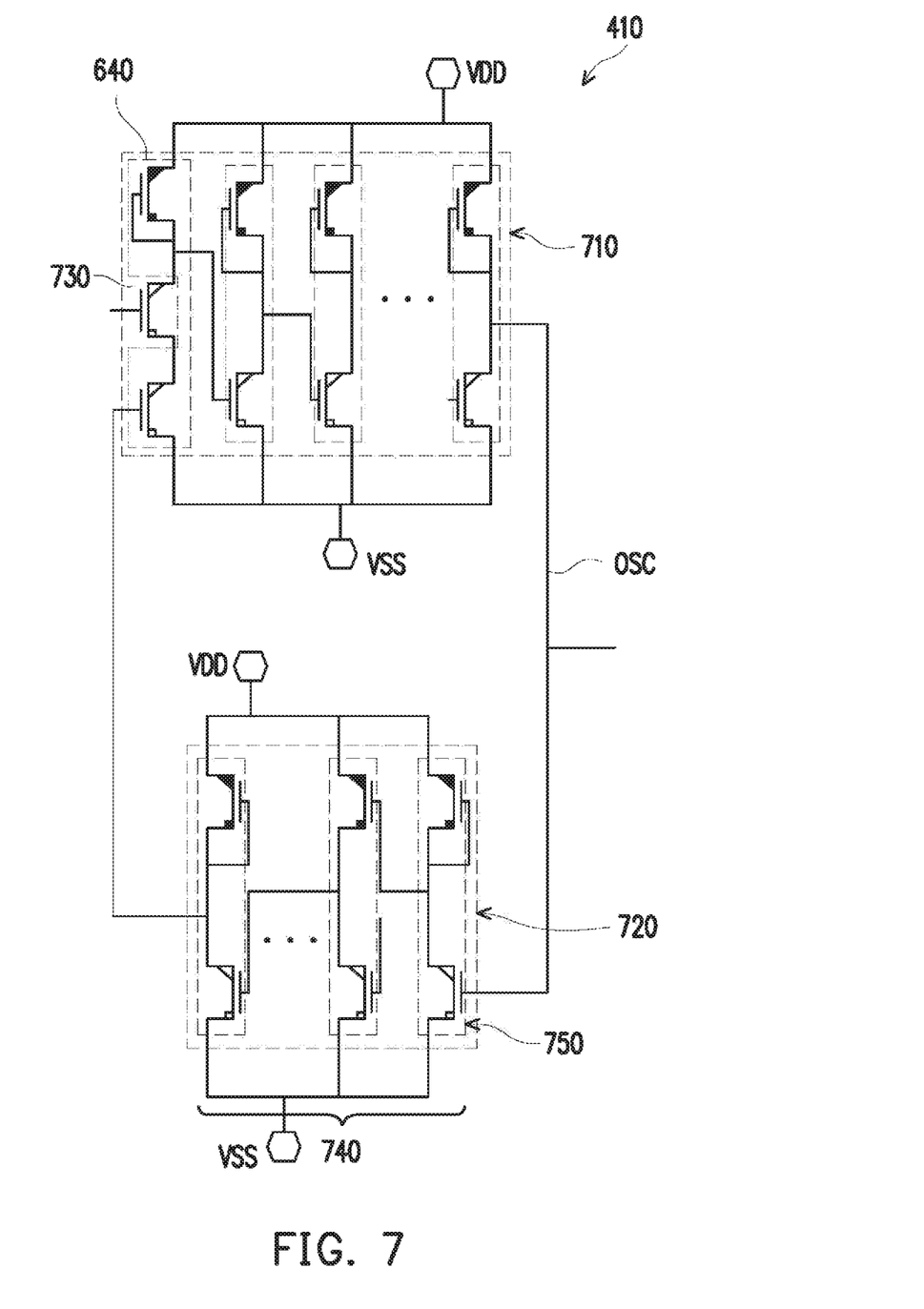
FIG. 7 is a schematic circuit diagram illustrating the ring oscillator of FIG. 4 in accordance with various embodiments of the present disclosure.

FIG. 7 is a schematic circuit diagram illustrating the ring oscillator 410 in accordance with various embodiments of the present disclosure. As illustrated in FIG. 7, the ring oscillator 410 includes a feedforward oscillating module 710, a feedback oscillating module 720, and an enabling module 730. The feedforward oscillating module 710 has input and output terminals, is configured/operable to generate an oscillation signal (OSC) at the output terminal thereof, and includes stages (for simplicity purpose, only one of the stages of the feedforward oscillating module 710 is labeled as 640) between the input and output terminals thereof. The feedback oscillating module 720 has input and output terminals connected to the output and input terminals of the feedforward oscillating module 710, respectively, is configured to route/feed the oscillation signal (OSC) at the output terminal of the feedforward oscillating module 710 back to the input terminal of the feedforward oscillation module 710, and includes stages (for simplicity purpose, only one of the stages of the feedback oscillating module 720 is labeled as 750). Each of the stages of the modules 710, 720 includes a pair of HEMTs, one of which is a D-HEMT and the other of which is an E-HEMT.

With further reference to FIG. 6, the input terminals of the true and complement modules 610, 620 are connected to each other and to the output terminal of the feedforward oscillating module 710.

In operation, when a voltage at the gate terminal of the HEMT of the enabling module 730 transitions from the low voltage level to the high voltage level, the feedforward oscillating module 710 generates the oscillation signal (OSC) at the output terminal thereof. As a result, the true and complement modules 610, 620 generate the true and complement clock signals, $V_{clock}$ and $V_{clockbar}$, at the output terminals thereof, respectively, whereby the voltage multiplier 430 generates the charge pump voltage, $V_{CP}$, at the output terminal of the charge pump circuit 180.

It will be appreciated that, after reading this disclosure, the charge pump circuit 180 may be of any suitable construction so long as it achieves the intended purpose described herein.

Figure 8:
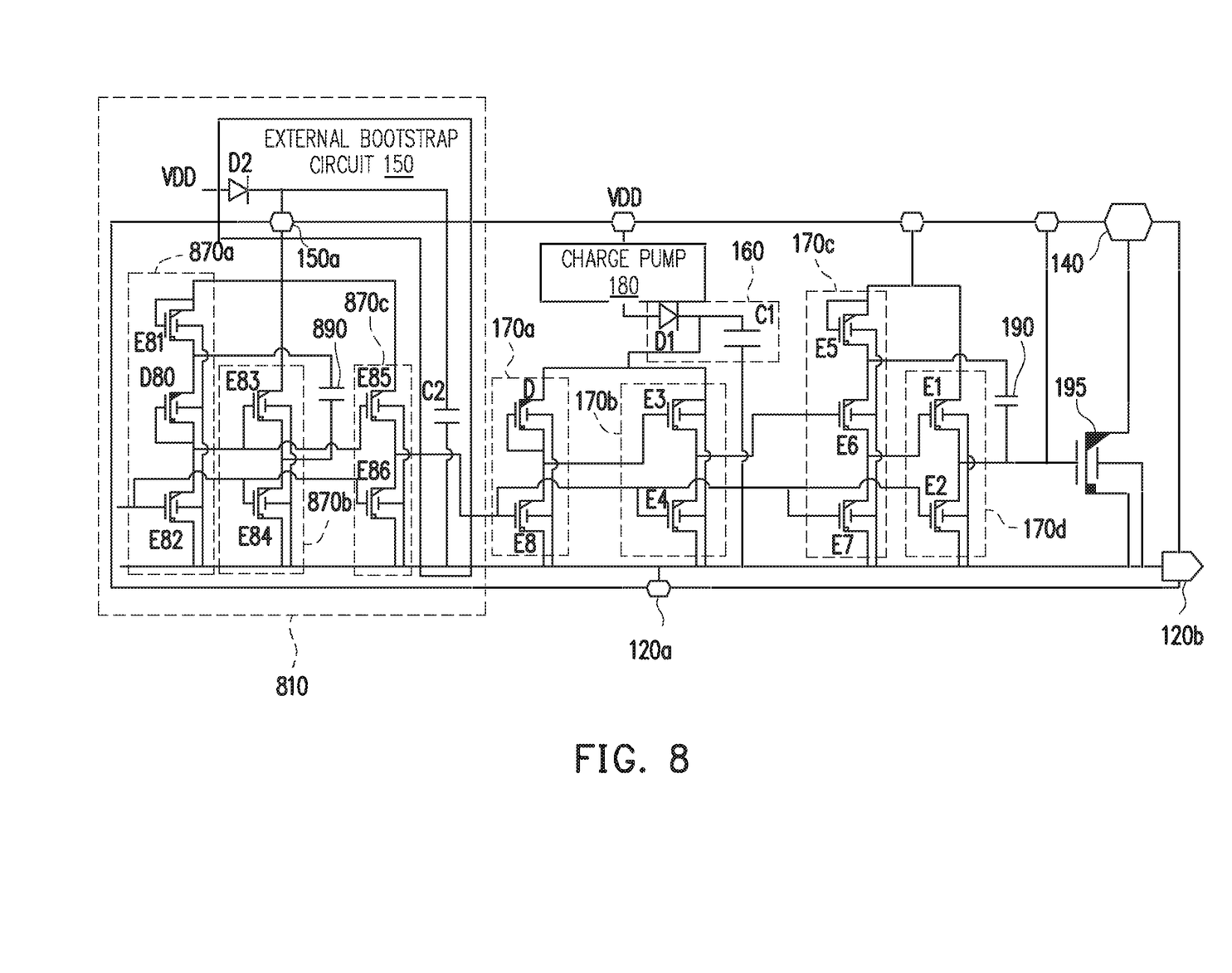
FIG. 8 is another schematic diagram of a fourth exemplary semiconductor device in accordance with various embodiments of the present disclosure.

FIG. 8 is another schematic diagram of a fourth exemplary semiconductor device 800 in accordance with various embodiments of the present disclosure. The fourth exemplary semiconductor device 800 includes a boot-strapped inverting buffer circuit 810. Boot-strapped inverting buffer circuit 810 includes one or more stages 870a, 870b, 870c, which each operate as an inverter. Stage 870a includes two E-HEMTs E81, E82 and a D-HEMT D80. Stage 870b includes two E-HEMTs E83, E84. Stage 870c include two E-HEMTs E85, E86. Each stage 870a, 870b, 870c can consume at least one threshold voltage, $V_t$, drop across each transistor (e.g., approximately 2V for $V_t$ of approximately 1.5V with 3-σ variation of approximately 0.5V).

An input voltage is provided to stage 870a via a gate terminal of E-HEMT E82, E84, and E86. A first source/drain terminal of E-HEMT E82 is coupled to a second source/drain terminal of D-HEMT D80 and a gate terminal of E-HEMT E85. The gate terminal of D-HEMT D80 is coupled to the second source/drain terminal of D-HEMT D80 and second source/drain terminal of E-HEMT E82. The second source/drain terminal of D-HEMT D80 is coupled to a first source/drain terminal of E-HEMT 81. The gate terminal of E-HEMT E81 is coupled to the second source/drain terminal of E-HEMT E81, the second source/drain terminal of E-HEMT E83 of stage 870b, the second source/drain terminal of E-HEMT E85 of stage 870c, and external bootstrap voltage pin 150a. The second source/drain terminal of D-HEMT D80 and the first source/drain terminal of E-HEMT E81 is coupled to a first terminal of capacitor 890. A second terminal of capacitor 890 is coupled to the first source/drain terminal of E-HEMT E83 and the second source/drain terminal of E-HEMT E84. The first source/drain terminal of E-HEMT E85 is coupled to the second source/drain terminal of E-HEMT E86 and the gate terminal of E-HEMT E8.

External bootstrap circuit 150 is coupled to boot-strapped inverting buffer circuit 810 via a first source/drain terminal of E-HEMT E83. Boot-strapped inverting buffer circuit 810 is configured to reduce the input loading at the gate terminal of E8 of stage 170a. The gate terminal of E8 is subject to large load values resulting from the operation of E-HEMT E82, E84, E7, and E2 as those E-HEMTS are required to be significantly large in order to pull low at the gate terminal of power transistor 195. Input loading at the gate terminal E-HEMT E82 is much less as it sees smaller loads from E-HEMT E82, E84, and E86.

Figure 9:
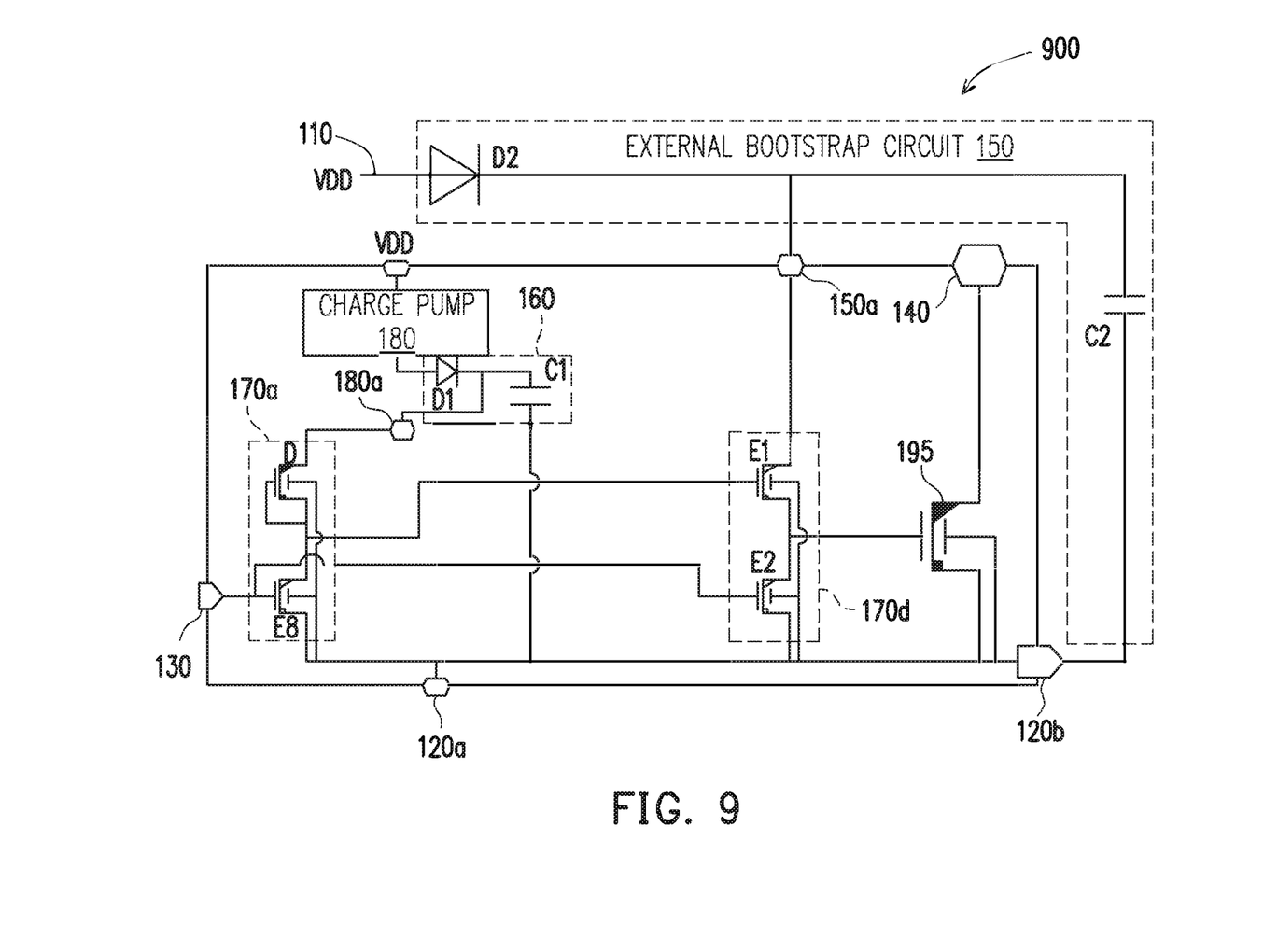
FIG. 9 is another schematic diagram of a fifth exemplary semiconductor device in accordance with various embodiments of the present disclosure.

FIG. 9 is another schematic diagram of a fifth exemplary semiconductor device 900 in accordance with various embodiments of the present disclosure. Semiconductor device 900 includes a minimal staged boot-strapped driver (e.g., stage 170a and 170d). In this embodiment, semiconductor device 900 is able to provide a gate voltage of approximately 662V (vs a maximum of 654V for a multiple-bootstrapped driver such as the embodiment of FIG. 2). In accordance with this embodiment charge pump circuit 180 can provide a voltage output to diode D1 of approximately 14V.

Figure 10:
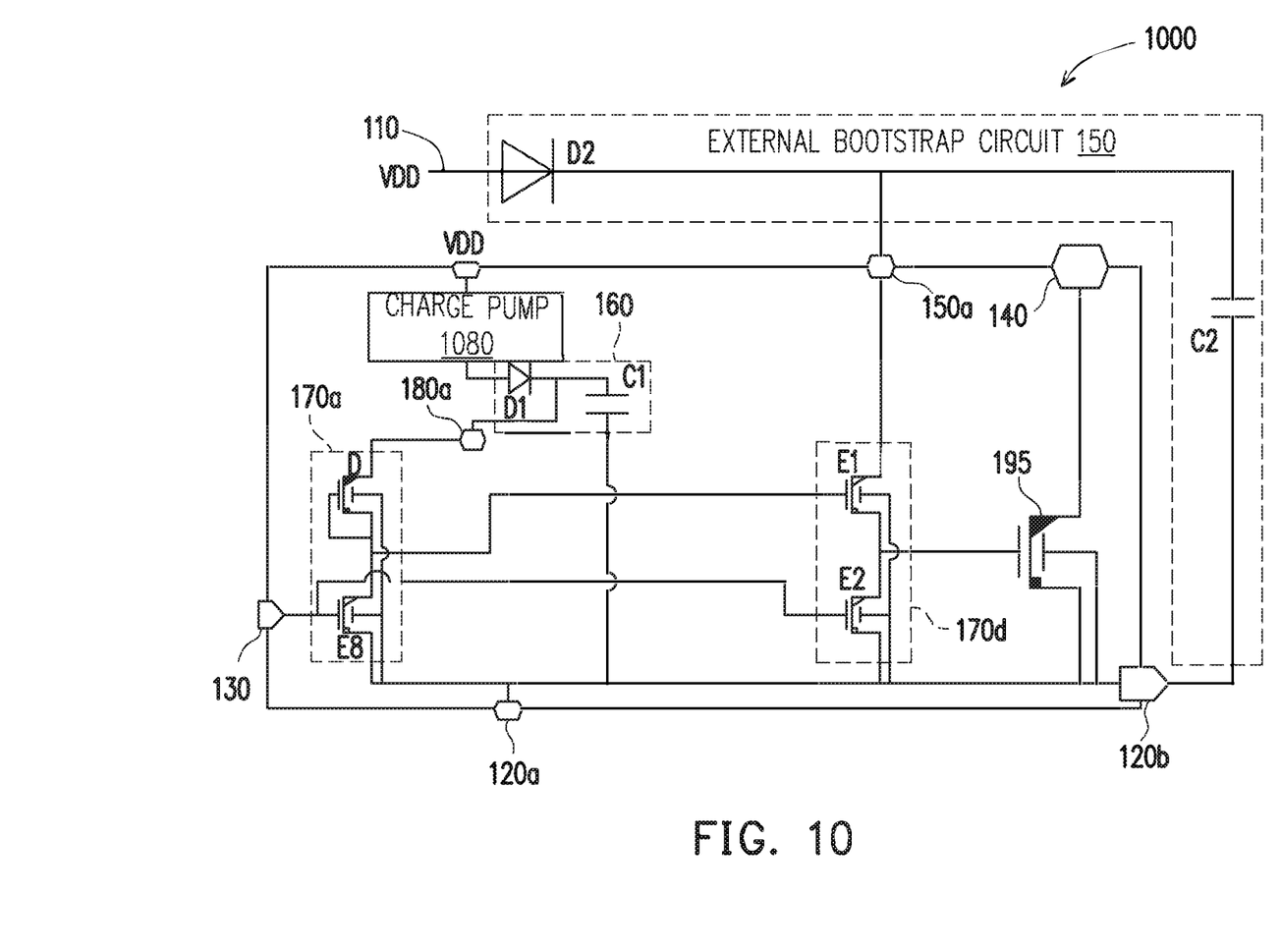
FIG. 10 is another schematic diagram of a sixth exemplary semiconductor device in accordance with various embodiments of the present disclosure.

FIG. 10 is another schematic diagram of a sixth exemplary semiconductor device 1000 in accordance with various embodiments of the present disclosure. In accordance with this embodiment charge pump circuit 1080 can provide a voltage output to diode D1 of approximately 10V. An overdrive voltage (e.g., $V_{ovd} \sim V_{gs} - V_t$) of approximately 0.5V is provided to the gate terminal of E-HEMT E1. This overdrive voltage in turn provides a sufficient voltage to the gate terminal of power transistor 195.

Figure 11:
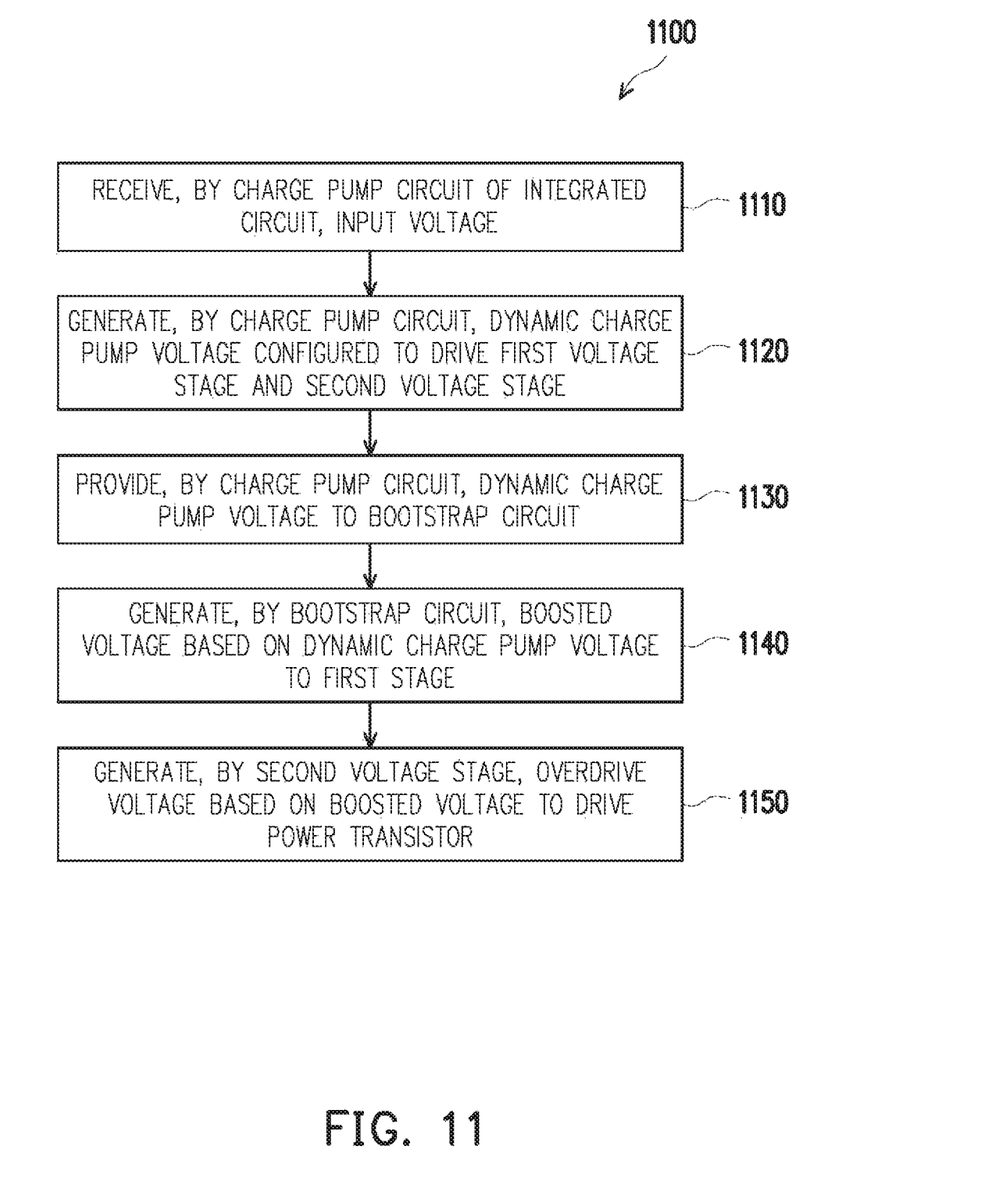
FIG. 11 is a flow chart of a first exemplary method of driving a power transistor in accordance with various embodiments of the present disclosure.

FIG. 11 is a flow chart 1100 of a first exemplary method of driving a power transistor in accordance with various embodiments of the present disclosure. The method is applicable to a wide variety of underlying structures. But for ease of understanding, the steps of FIG. 11 are described with reference to structures depicted in FIGS. 1-4 and 8-10. An input voltage is received, at 1110, by a charge pump circuit of an integrated circuit. The charge pump circuit generates, at 1120, a dynamic charge pump voltage configured to drive a first voltage stage and a second voltage stage of the integrated circuit. The charge pump circuit provides, at 1130, a dynamic charge pump voltage to a bootstrap circuit of the integrated circuit. The bootstrap circuit generates, at 1140, a boosted voltage based on the dynamic charge pump voltage to the first stage. The second stage generates, at 1150, an overdrive voltage based on the voltage to drive a power transistor of the integrated circuit.

Use of the various circuits and configurations as described herein can enable the generations of high dynamic boost voltages to drive electronic components coupled thereto. Utilizing the combination of E-HEMT and D-HEMT devices as described herein can minimize the levels of static current within an integrated circuit. The less static current within the integrated circuit, the less power the integrated circuit consumes and the less potential damage the circuit can experience. The various staged HEMTs as described herein can also enable more efficient power delivery of an input voltage to a power transistor driving one or more electrical components coupled thereto.

In one embodiment, an integrated circuit includes a driving circuit, a charge pump circuit, and a bootstrap circuit. The driving circuit has a first stage and a second stage and is configured to provide an overdrive voltage. The charge pump circuit is coupled between the first stage and the second stage and is configured to generate a dynamic voltage greater than the overdrive voltage. The bootstrap circuit is coupled to the charge pump circuit and configured to increase the overdrive voltage of the driving circuit.

In another embodiment, a method includes receiving, by a charge pump circuit of an integrated circuit, an input voltage. The charge pump circuit generates a dynamic charge pump voltage and is configured to drive a first voltage stage and a second voltage stage of the integrated circuit. The charge pump circuit provides the dynamic charge pump voltage to a bootstrap circuit. The bootstrap circuit generates a boosted voltage based on the dynamic charge pump voltage to the first stage. The second voltage stage generates an overdrive voltage based on the boosted voltage to drive a power transistor.

In yet another embodiment, a system includes a high-side driver, a charge pump circuit, and a power transistor. The high-side driver has a plurality of staged HEMTs configured to provide an overdrive voltage. The charge pump circuit is coupled between a first portion of the plurality of staged HEMTs and a second portion of the plurality of staged HEMTs. The charge pump circuit is configured to generate a dynamic charge-pump voltage greater than the overdrive voltage. The power transistor is coupled to an output to the high-side driver and one or more electrical components and configured to provide a voltage based on the overdrive voltage to the one or more electronic components.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a driving circuit having a first stage and a second stage, the driving circuit configured to provide an overdrive voltage, wherein the first stage comprises a depletion-mode high electron mobility transistor (D-HEMT) and the first stage and the second stage have a shared voltage input;
   a charge pump circuit coupled between the D-HEMT and the second stage, wherein the charge pump circuit is configured to generate a dynamic voltage greater than the overdrive voltage; and
   a bootstrap circuit coupled to the charge pump circuit, wherein the bootstrap circuit is configured to increase the overdrive voltage of the driving circuit.

2. The integrated circuit of claim 1, further comprising a power transistor coupled to the driving circuit, wherein the overdrive voltage drives the power transistor.

3. The integrated circuit of claim 1, wherein the bootstrap circuit comprises:
   a bootstrap diode having a cathode terminal coupled to the second stage; and
   a bootstrap capacitor coupled between the cathode terminal and a output pin of the driving circuit.

4. The integrated circuit of claim 1, wherein the first stage further comprises a first enhanced-mode high electron mobility transistor (E-HEMT) and the second stage comprises a second and third enhanced-mode high electron mobility transistor (E-HEMT), wherein a gate terminal of the D-HEMT is coupled to a source/drain terminal of the first E-HEMT and a source/drain terminal of the D-HEMT is coupled to the charge pump circuit.

5. The integrated circuit of claim 4, wherein the first E-HEMT and the second E-HEMT are in an off-state at a zero gate-source voltage and wherein the D-HEMT is operational when a voltage of zero is applied to a gate of the D-HEMT and non-operational when a negative voltage is applied to the gate.

6. The integrated circuit of claim 1, wherein the driving circuit further comprises a third stage having a pair of enhanced-mode high electron mobility transistors (E-HEMT).

7. The integrated circuit of claim 3, wherein the driving circuit further comprises a fourth stage having a first enhanced-mode high electron mobility transistor (E-HEMT), a second E-HEMT, and a third E-HEMT, the first E-HEMT having a first source/drain terminal and a gate terminal coupled to the cathode terminal of the bootstrap diode.

8. The integrated circuit of claim 1, further comprising an internal bootstrap circuit having a diode coupled between the charge pump circuit and the first stage and a capacitor coupled between the diode and a reference voltage pin.

9. The integrated circuit of claim 1, further comprising a boot-strapped inverting buffer circuit configured to reduce an input load of the first stage.

10. A method comprising:
receiving, by a charge pump circuit of an integrated circuit, an input voltage;
generating, by the charge pump circuit, a dynamic charge pump voltage configured to drive a first voltage stage and a second voltage stage of the integrated circuit, wherein the first voltage stage comprises a depletion-mode high electron mobility transistor (D-HEMT), and the charge pump circuit is coupled between the D-HEMT and the second voltage stage;
providing, by charge pump circuit, the dynamic charge pump voltage to a bootstrap circuit, wherein the bootstrap circuit is coupled to the charge pump circuit;
generating, by the bootstrap circuit, a boosted voltage based on the dynamic charge pump voltage to the first stage;
receiving, by the first voltage stage and the second voltage stage, a shared voltage input; and
generating, by the second voltage stage, an overdrive voltage based on the boosted voltage to drive a power transistor.

11. The method of claim 10, wherein the overdrive voltage exceeds a minimum voltage threshold of the power transistor.

12. The method of claim 10, further comprising:
minimizing a static current of the first stage and the second stage; and
modifying, by the bootstrap circuit, an impedance of the first stage to minimize the static current.

13. A system comprising:
a high-side driver having a plurality of staged high electron mobility transistors (HEMTs), the high-side driver configured to provide an overdrive voltage;
a charge pump circuit coupled between a first portion of the plurality of staged HEMTs and a second portion of the plurality of staged HEMTs, the first portion comprising a depletion-mode HEMT (D-HEMT), the charge pump is configured to generate a dynamic charge-pump voltage greater than the overdrive voltage, wherein the first portion and the second portion have a shared voltage input; and
a power transistor coupled between the high-side driver and one or more electrical components, wherein the power transistor is configured to provide a voltage based on the overdrive voltage to the one or more electronic components.

14. The system of claim 13, further comprising a bootstrap circuit coupled between an output pin and the charge pump circuit configured to increase the overdrive voltage of the high-side driver.

15. The system of claim 14, wherein the bootstrap circuit comprises:
a bootstrap diode having a cathode terminal coupled to one of the plurality of staged HEMTs; and
a bootstrap capacitor coupled between the cathode terminal and the output pin of the high-side driver.

16. The system of claim 13, wherein one of the plurality of staged HEMTs comprises a first enhanced-mode high electron mobility transistor (E-HEMT), and another of the plurality of the staged HEMTs comprises a second and third enhanced-mode high electron mobility transistor (E-HEMT), wherein a gate terminal of the D-HEMT is coupled to a source/drain terminal of the first E-HEMT and a source/drain terminal of the D-HEMT is coupled to the charge pump circuit.

17. The system of claim 16, wherein the first E-HEMT and the second E-HEMT are in an off-state at a zero gate-source voltage and wherein the D-HEMT is operational when a voltage of zero is applied to a gate of the D-HEMT and non-operational when a negative voltage is applied to the gate.

18. The integrated circuit of claim 13, wherein the plurality of staged HEMTS includes a pair of enhanced-mode high electron mobility transistors (E-HEMT).

19. The system of claim 16, wherein the plurality of staged HEMTs further comprises a fourth stage having a first enhanced-mode high electron mobility transistor (E-HEMT), a second E-HEMT, and a third E-HEMT, the first E-HEMT having a first source/drain terminal and a gate terminal coupled to the cathode terminal of the bootstrap diode.

20. The system of claim 13, further comprising an internal bootstrap circuit having a diode coupled between the charge pump circuit and one of the plurality of HEMTs and a capacitor coupled between the diode and a reference voltage pin.

* * * * *